United States Patent [19]
Ishikawa

[11] Patent Number: 5,965,446
[45] Date of Patent: Oct. 12, 1999

[54] METHOD FOR PLACING FLUORESCENT SINGLE MOLECULES ON SURFACE OF SUBSTRATE AND METHOD FOR VISUALIZING STRUCTURAL DEFECT OF SURFACE OF SUBSTRATE

[75] Inventor: Mitsuru Ishikawa, Hamamatsu, Japan

[73] Assignee: Hamamatsu Photonics K.K., Hamamatsu, Japan

[21] Appl. No.: 08/957,360

[22] Filed: Oct. 24, 1997

[30] Foreign Application Priority Data

Oct. 24, 1996 [JP] Japan .................... 8-282517

[51] Int. Cl.⁶ ............. G01N 15/08; G01N 21/64
[52] U.S. Cl. ............. 436/5; 436/172; 356/237.1; 356/237.5
[58] Field of Search .......... 436/5, 172; 356/237.1, 356/237.5; 427/157, 355

[56] References Cited

U.S. PATENT DOCUMENTS

| | | | |
|---|---|---|---|
| 2,920,203 | 1/1960 | Switzer et al. | 436/5 |
| 3,708,665 | 1/1973 | Prine | 250/71 T |
| 3,753,647 | 8/1973 | Molina | 8/85 |
| 3,899,450 | 8/1975 | Molina | 252/301.2 P |

(List continued on next page.)

FOREIGN PATENT DOCUMENTS

| | | |
|---|---|---|
| 0 601 714 | 6/1994 | European Pat. Off. . |
| 1-176932 | 7/1989 | Japan . |
| WO 95/10034 | 4/1995 | WIPO . |

OTHER PUBLICATIONS

E.S. Peterson et al., A New Technique for the Determination of Surface Absorbate Geometries Utilizing Second Harmonic Generation and Absorption Band Shifts, J. Chem. Phys. 91 (4), Aug. 15, 1989, 2683.

Robert M. Dickson et al., Three–Dimensional Imaging of Single Molecules Solvated in Pores of Poly(Acrylamide) Gels, Science vol. 274, Nov. 8, 1996 966.

Eric Betzig et al., Single Molecules Observed by Near–Field Scanning Optical Microscopy, Science. vol. 262, Nov. 26, 1993, 1422.

Dialog Prints, Jett J H; 007864938 WPI Acc No.: 89–130050/17.

Naohiko Fujino et al.; Oyobutsuri, vol. 66, No. 7, pp. 732–734, entitled "Atomic force microscopy observation and formation mechanism of silicon crystal–originated intrinsic surface defects" Published on Jul. 10, 1997.

Takao ABE; Baihukan, pp. 310–327, entitled "Silicon–crystal growth and wafer processing" Published on May 10, 1994.

Kamiparupugijutukyokai, pp. 52–53, 66–69, 72–73, entitled "Kind and examination method of paper pulp" Published on Jul. 25, 1966.

Dialog Prints, Shera E B 009473353 WPI Acc No.: 93–166894/20.

Dialog Prints, Schwartz D C 010254092 WPI Acc No.: 95–155347/20.

*Primary Examiner*—Jill Warden
*Assistant Examiner*—Kevin P. Cannell
*Attorney, Agent, or Firm*—Pillsbury Madison & Sutro LLP

[57] ABSTRACT

A method for placing fluorescent single molecules on a surface of a substrate includes dropping a sample solution in which fluorescent molecules are dissolved in a predetermined concentration in a volatile, organic solvent, onto a slip of paper placed on the substrate and pulling the slip of paper so as to make the dropped sample solution traverse the surface of the substrate before the organic solvent evaporates. Since a single molecular layer of fluorescent molecules with high uniformity can be placed readily on the surface of the substrate, measurement of fluorescence and measurement of scattered light can be carried out accurately and structural defects of the surface of substrate can be visualized from luminous spots of fluorescence and from luminous spots of scattered light.

12 Claims, 8 Drawing Sheets

U.S. PATENT DOCUMENTS

| | | | |
|---|---|---|---|
| 4,044,253 | 8/1977 | Crane | 250/302 |
| 4,334,879 | 6/1982 | Fujimori | 23/230 |
| 4,375,384 | 3/1983 | Molina | 156/626 |
| 4,625,167 | 11/1986 | Fitzpatrick | 324/235 |
| 4,962,037 | 10/1990 | Jett et al. . | |
| 4,968,892 | 11/1990 | McAtee | 250/458.1 |
| 5,149,138 | 9/1992 | Zemsky | 283/70 |
| 5,209,834 | 5/1993 | Shera . | |
| 5,372,930 | 12/1994 | Colton et al. . | |
| 5,389,302 | 2/1995 | Warren, Jr. | 436/5 |
| 5,416,594 | 5/1995 | Gross et al. | 356/237 |
| 5,494,828 | 2/1996 | Leopando | 436/180 |
| 5,629,768 | 5/1997 | Hagiwara | 356/237.5 |
| 5,633,172 | 5/1997 | Shimazaki | 436/5 |
| 5,742,395 | 4/1998 | Biedermann et al. | 356/237.5 |

METHOD FOR PLACING FLUORESCENT SINGLE MOLECULES ON SURFACE OF SUBSTRATE AND METHOD FOR VISUALIZING STRUCTURAL DEFECT OF SURFACE OF SUBSTRATE

BACKGROUND OF THE INVENTION

1. Field of the Invention

The present invention relates to a method for placing fluorescent single molecules on a surface of a substrate and, more particularly, to a method for placing fluorescent single molecules on a surface of a substrate such as a silicon wafer and a method for visualizing a structural defect of the surface of substrate.

2. Related Background Art

Recent advance in single molecule imaging methods based on detection of fluorescence has been realizing observations of position, orientation, motion, photochemical reaction, enzyme reaction, and relaxation process of excited state of individual pigment molecules at room temperature. Particularly, the success in determining orientations of individual pigment molecules by scanning near-field microscopy and scanning confocal microscopy is owing to fixation of pigment molecules. In this case, the pigment molecules are doped in a polymer. In contrast to it, use of an ordinary optical microscope provided with a television camera enables us to simultaneously observe a plurality of individual molecules without mechanical scanning.

A conventional, simple arraying method of single molecules is the spin coating method, by which the pigment molecules are uniformly dispersed by spreading them on a substrate by use of a polymer. It is noted here that a "single molecule" means not only one molecule, but also a group of plural molecules as long as groups can be counted one by one separately (which is also the case in the following description).

It is, however, very hard to uniformly disperse the pigment molecules by the spin coating method unless the pigment molecules are spread with a nonvolatile material of high viscosity such as the polymer. With intervention of the nonvolatile material such as the polymer, the material would readily take contamination in from the outside. In particular, when excitation light was of a short wavelength, for example, in the ultraviolet region, there was the problem that fluorescence from impurities taken in from the outside or fluorescence of the polymer itself in some cases, may obstruct measurement of fluorescence of single molecule at a high possibility.

Incidentally, to decrease defects and particles of the submicron or smaller order on a surface of a semiconductor wafer typified by a silicon wafer is important to realizing high integration of semiconductor memory, for example. Some methods for efficiently recognizing actual states of defects and particles on the surface of semiconductor wafer were proposed and are under practical use. For example, there are reports on the light-scattering method or on a method for combining the light-scattering method with atomic force microscope (hereinafter referred to as AFM) (for example, Fujino et al., Oyo Buturi Vol. 66, No. 7 1997, PP 723–733). The former method allows us to detect the particles and defects in sizes ranging from approximately the wavelength of light used to approximately one tenth thereof. The latter method also allows us not only to detect the particles and defects, but also to evaluate the sizes thereof. A feature of the light-scattering method is the capability of readily detecting presence or absence of defects or particles scattered in a wide area (50 to 100 micron square) as compared with the sizes (of the submicron or less) of defects and particles. However, when the particles and defects have the sizes of below the diffraction limit of light, presence thereof can be detected, but the exact sizes thereof cannot be measured. It is difficult to distinguish the defects from adhering particles and it is not possible to determine whether a defect is convex or concave with respect to the surrounding surface. On the other hand, the AFM permits us to measure the exact sizes of particles and defects, even the sizes of below the diffraction limit of light which are impossible to measure by the light-scattering method. The AFM, however, has a drawback that a long measuring time is necessary for finding out the particles and defects which are scattered in the wide area as described above and locations of which are unknown.

Further, the combination of the light-scattering method with the AFM partly enables to make up for their drawbacks and make use of their advantages; but when the AFM taking the long measuring time is combined with the light-scattering method taking the measuring time not so long, the measuring time is after all determined by the measuring time of AFM. In addition, the AMF is not advantageous in terms of the cost of apparatus itself.

As described previously, the spin coating method had the problem that it had the high possibility that the fluorescence from the impurities taken in from the outside or the fluorescence of the polymer itself obstructed the measurement of fluorescence of single molecule.

Desires existed for measuring means for attaining information about distinction between particle and defect and, in the case of a defect, about whether it is convex or concave with respect to the surrounding surface in a simple manner and within a short measuring time equivalent to that by the light-scattering method.

SUMMARY OF THE INVENTION

It is, therefore, an object of the present invention to provide a method for placing the single molecules on the surface of substrate, by which individual molecules can be uniformly dispersed even with use of a volatile solvent of low viscosity, and a method for visualizing a structural defect of the surface of substrate.

A method according to the present invention is a method for placing fluorescent single molecules on a surface of a substrate, on the occasion of carrying out measurement of fluorescence of fluorescent molecules, comprising the steps of:

dissolving the fluorescent molecules in a predetermined concentration in a volatile, organic solvent, thereby preparing a sample solution;

placing a slip of paper on a substrate where the measurement of fluorescence is carried out;

dropping the sample solution onto the slip of paper placed on the substrate; and pulling the slip of paper so as to make the dropped sample solution traverse the surface of the substrate before the organic solvent evaporates.

According to the present invention, the fluorescent molecules are dissolved in the volatile, organic solvent, so that contaminations are hardly taken in from the outside, thereby preventing the solvent and contaminations from obstructing the fluorescence measurement. Since the sample solution dropped onto the slip of paper is pulled so as to traverse the surface of substrate, a single molecule layer of fluorescent molecules with high uniformity can be placed readily on the surface of substrate.

A method for visualizing a structural defect of a surface of a substrate, on the occasion of carrying out measurement of fluorescence of fluorescent molecules, comprising the steps of:

dissolving the fluorescent molecules in a predetermined concentration in a volatile, organic solvent, thereby preparing a sample solution;

placing a slip of paper on a substrate where the measurement of fluorescence is carried out;

dropping the sample solution onto the slip of paper placed on the substrate;

pulling the slip of paper so as to make the dropped sample solution traverse the surface of the substrate before the organic solvent evaporates, thereby placing the fluorescent single molecules on the surface of the substrate;

radiating laser light to the surface of the substrate on which the fluorescent single molecules are placed;

then measuring fluorescence generated in the surface of the substrate; and obtaining a luminous spot of fluorescence from the fluorescence measured.

According to this invention, the measurement is carried out for the single molecule layer of fluorescent molecules with high uniformity placed on the surface of substrate, so that accurate fluorescence measurement can thus be carried out, thereby visualizing the structural defect of the surface of substrate from the luminous spot of fluorescence.

Another method for visualizing a structural defect of a surface of a substrate, on the occasion of carrying out measurement of scattered light of the surface of the substrate on which fluorescent molecules are deposited, comprising the steps of:

dissolving the fluorescent molecules in a predetermined concentration in a volatile, organic solvent, thereby preparing a sample solution;

placing a slip of paper on a substrate where the measurement of scattered light is carried out;

dropping the sample solution onto the slip of paper placed on the substrate;

pulling the slip of paper so as to make the dropped sample solution traverse the surface of the substrate before the organic solvent evaporates, thereby placing the fluorescent single molecules on the surface of the substrate;

radiating laser light to the surface of the substrate on which the fluorescent single molecules are placed;

then measuring scattered light generated in the surface of the substrate; and obtaining a luminous spot of scattered light from the scattered light measured.

According to this invention, the measurement is carried out for the surface of the substrate on which the single molecule layer of fluorescent molecules with high uniformity is placed. Therefore, an accurate measurement of scattered light result from irregulality of the surface of the substrate itself instead of pigment molecules themselves can be carried out. By comparing the position of the luminous spot of scattered light and the position of luminous spot of fluorescence observed in the same field and used same sample as in the measurement of scattered light, structural defect of the surface of the substrate can be visualized. In this case, since the uniformity of the single molecule layer of fluorescent molecules is high, fluorescent molecules themselves do not contribute to generate scattering light.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIGS. 1A and 1B are schematic, explanatory drawings to show a method for placing the fluorescent single molecules on a surface of substrate according to an embodiment of the present invention, wherein

FIGS. 4A–4D are drawing to show traces of microphotographs of luminous spots of fluorescence achieved when sample solutions of respective concentrations are fixed on the substrate, wherein

FIGS. 5A–5C are histograms to show statistical distributions of frequency of occurrence of fluorescent photon number obtained when numbers of fluorescent photons contributing to individual luminous spots of fluorescence are counted, wherein

FIGS. 6A–6C are drawings to show traces of microphotographs of luminous spots of fluorescence attained in use of the sample solution of $1.47 \times 10^{-4}$ M and at temperatures changed, wherein

FIG. 7A and FIG. 7B are drawings to show traces of microphotographs attained when the fluorescent photon measuring apparatus shown in FIG. 2 is used and when the sample solution is fixed on the substrate, wherein FIG. 8A and FIG. 8B are drawing to show traces of microphotographs obtained when the fluorescent photon measuring apparatus shown in FIG. 2 is used and when the sample solution is prepared on the substrate without cleaning excess particles that were removable by the lens cleaning paper, wherein

DESCRIPTION OF THE PREFERRED EMBODIMENTS

The embodiments of the present invention will be described by reference to the accompanying drawings.

Figure 1A:
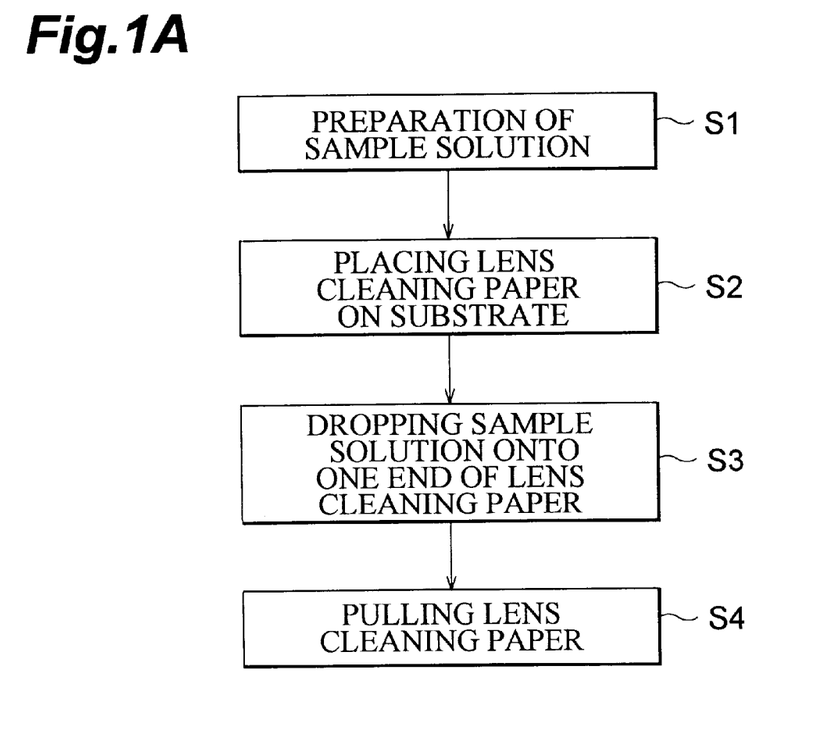
FIG. 1A is a flowchart thereof and FIG. 1B is a perspective view of the substrate and lens cleaning paper.
Figure 1B:
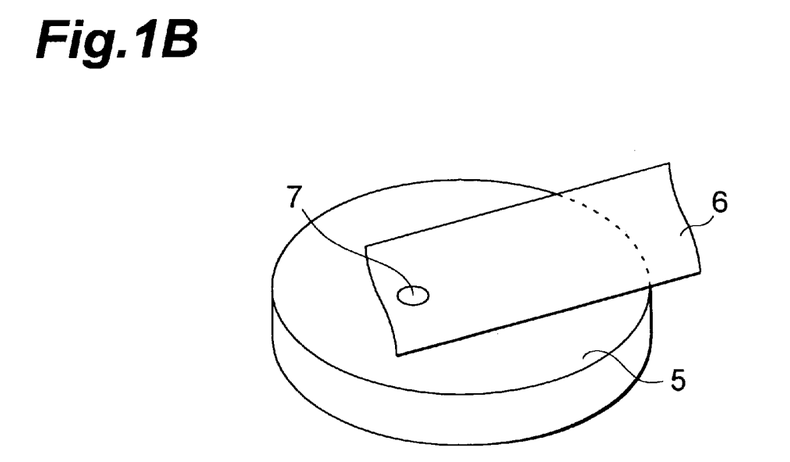

FIGS. 1A and 1B are schematic, explanatory drawings to show the method for placing the fluorescent single molecules on the surface of substrate according to an embodiment of the present invention, wherein FIG. 1A is a flowchart thereof and FIG. 1B a perspective view of the substrate and lens cleaning paper being a slip of paper.

First, a sample solution used for measurement of fluorescence of fluorescent molecules is prepared at step 1 of FIG. 1A. The sample solution is prepared by dissolving fluorescent molecules, which are measured objects in the measurement of fluorescence, in a predetermined concentration in a volatile, organic solvent.

The fluorescent molecules that can be used in the present invention are those selected, for example, from rhodamine B, various coumarin derivatives, rhodamine 6G, rhodamine 110, sulforhodamine 640, fluorescein, uranine, Nile blue, cresyl violet, acridine orange, malachite green and crystal violet in behalf of triphenylmethane pigments, cyanine pigments, and so on. Particularly, any fluorescent material that is soluble in methanol and other volatile, organic solvent to be mentioned later can be used without any specific limitation.

Such fluorescent molecules are dissolved preferably in a concentration of $10^{-4}$ M or less, more preferably in a concentration of about $10^{-5}$ M in the organic solvent. Concentrations of the fluorescent molecules over $10^{-4}$ M are not preferred, because the fluorescent molecules themselves tend to solidify. More preferably, the concentration of the fluorescent molecules is controlled to be $10^{-7}$ M or more. This is because if the concentration of the fluorescent molecules is less than $10^{-7}$ M the fluorescent molecules will not spread all over the pits of substrate 5.

The volatile, organic solvent is preferably selected, for example, from alcohols, such as methanol and ethanol, ethers, acetone, ethylene glycol, and so on.

Next, at step 2 the lens cleaning paper 6 is placed on the substrate 5, for example, on a silicon wafer. There is no specific limitation on the substrate 5 as long as the surface thereof is smooth. A variety of platelike members can be used as the substrate.

The present embodiment employs the lens cleaning paper 6 as a preferred example of slip of paper, but various slips of paper can be used if they have some strength and permeability and do not discharge particles. For example, preferred paper is carbon base paper (JIS P3901) or thin paper (machine made Japanese paper, JIS P4500) according to Japanese Industrial Standards.

Namely, slips of paper that can be employed in the present invention are those having characteristics equivalent to those of the carbon base paper having the tensile strength 1.3 kg or more longitudinal and 0.6 kg or more lateral and the rupture stress 0.3 kg/cm$^2$ or more as described in above JIS P3901.

In addition, the present invention can also adopt slips of paper having characteristics equivalent to those of the thin paper having the breaking length 4.0 km or more longitudinal and 1.3 km or more lateral as described in above JIS P4500.

Next, at step 3 the sample solution 7 prepared at step 1 is dropped onto one end of the lens cleaning paper 6. A drop amount of the sample solution 7 is preferably, for example, 20 μl to 200 μl in case of using a silicon wafer of the diameter of 2 inches and can be changed with necessity depending upon the cleaning paper 6 used or the size of substrate 5.

The sample solution 7 thus dropped spreads by capillarity on the lens cleaning paper 6 and permeates to the back side of the lens cleaning paper 6 so as to reach the surface of substrate 5.

Then, at step 4 the other end of the lens cleaning paper 6 is pulled so as to make the dropped sample solution 7 traverse the surface of substrate 5 before the organic solvent evaporates, whereby the surface of substrate 5 is coated with the sample solution 7. Then the lens cleaning paper 6 is removed from the substrate 5 and the sample solution 7 is dried, which will result in placing a single layer of fluorescent molecules on the surface of substrate 5. By this method the single molecule layer can be obtained with higher uniformity than in the case of use of the conventional spin coating method.

EXAMPLES

The present invention will be described in further detail with examples.

Example 1

First, the sample solution 7 of fluorescent molecule was prepared according to the following procedures. The fluorescent molecules were those of rhodamine B being an adsorptive pigment. Rhodamine B was dissolved in a predetermined concentration in methanol solution, thereby obtaining the sample solution 7. A silicon wafer of the diameter of 2 inches was used as the substrate 5. The lens cleaning paper 6 was placed on this substrate 5 and thereafter 50 μl of the sample solution 7 was dropped onto one end of the lens cleaning paper 6 as shown in FIG. 1B. Subsequently, the lens cleaning paper 6 was pulled so as to make the sample solution 7 traverse the surface of substrate 5 before the methanol solution evaporated.

Figure 2:
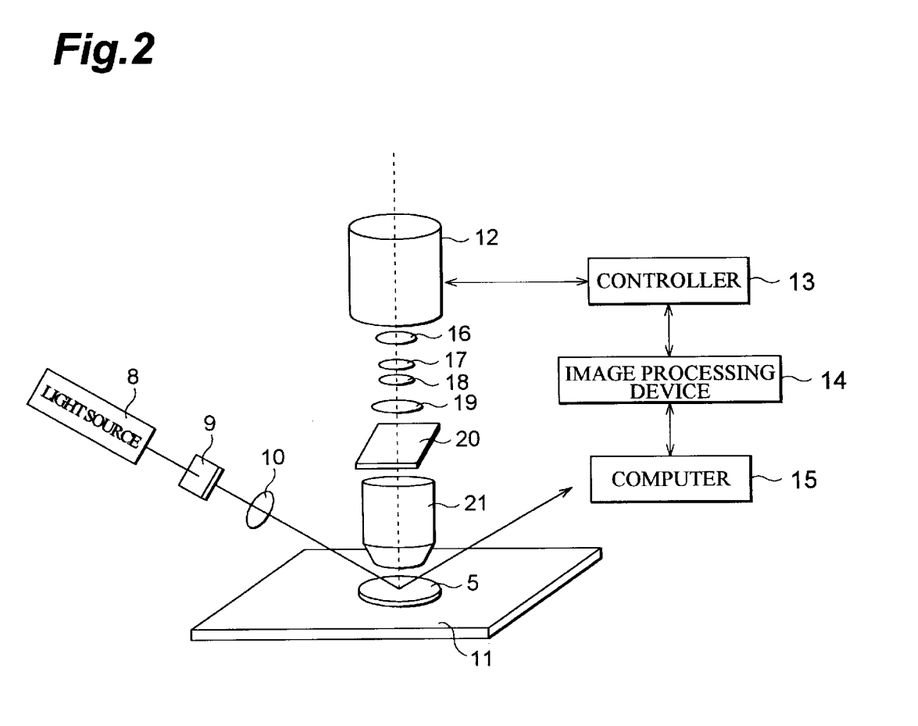
FIG. 2 is a schematic drawing to show a fluorescent photon measuring apparatus including an image processing device etc. used in the embodiment of the present invention.

Then quantitative evaluation of fluorescent photon number was carried out by the single photon counting method using the fluorescent photon measuring apparatus shown in FIG. 2. FIG. 2 is a schematic view to show the fluorescent photon measuring apparatus including the image processing device etc. In the drawing, a laser used as a light source 8 is a synchronous mode-locked dye laser with cavity damper pumped by a mode-locked argon ion laser. This laser had the pulse half width 10 ps and the lasing wavelength 540 nm and was used repetitively at the frequency 4 MHz and average output 14 mW. For avoiding the problem of orientation of sample molecules, the excitation light is converted from linear polarization to circular polarization by Babinet-Soleil compensator 9 and the circularly polarized light was made incident to the substrate 5 through lens 10. The substrate 5 is mounted on a stage 11 capable of moving three-dimensionally.

A single photon counting video camera system is composed of a camera head 12 for counting single photons, an image-intensifier (II) controller (hereinafter referred to simply as a controller) 13, an image processing device 14, and a computer 15. The camera head 12 is combined through a relay lens 16 with an epi-illumination fluorescence microscope and this microscope has two lenses 17, 18. Fluorescence is collected with objective lens 21 having the magnification of 100.

This objective lens 21 was trade name "NIKON CF M Plan SLWD" available from NIKON CORP., which had the numerical aperture 0.75 and the working distance 4.7 mm. Long-pass filter 19 (trade name "NIKON BA 580" available from NIKON CORP.) and dichroic filter 20 (trade name "NIKON DM 510" available from NIKON CORP.) were used for intercepting the excitation light from the surface of sample on the substrate 5. These filters are a standard combination in use of green excitation light.

An image digitized on the image processing device 14 was of 512×483 pixels and each pixel was 0.12 $\mu$m. The focal length of lens 18 was 100 mm and the intensity of excitation light was approximately 1.8 W/cm$^2$ on the surface of sample. Data obtained was accumulated at the maximum sensitivity of the photon counting camera for 30 seconds. All of the devices described above were installed in a clean booth cleanliness of which was class 1000. All experiments except for those related to FIGS. 6A–6C described hereinafter were conducted at 296 K in the atmosphere.

Figure 3:
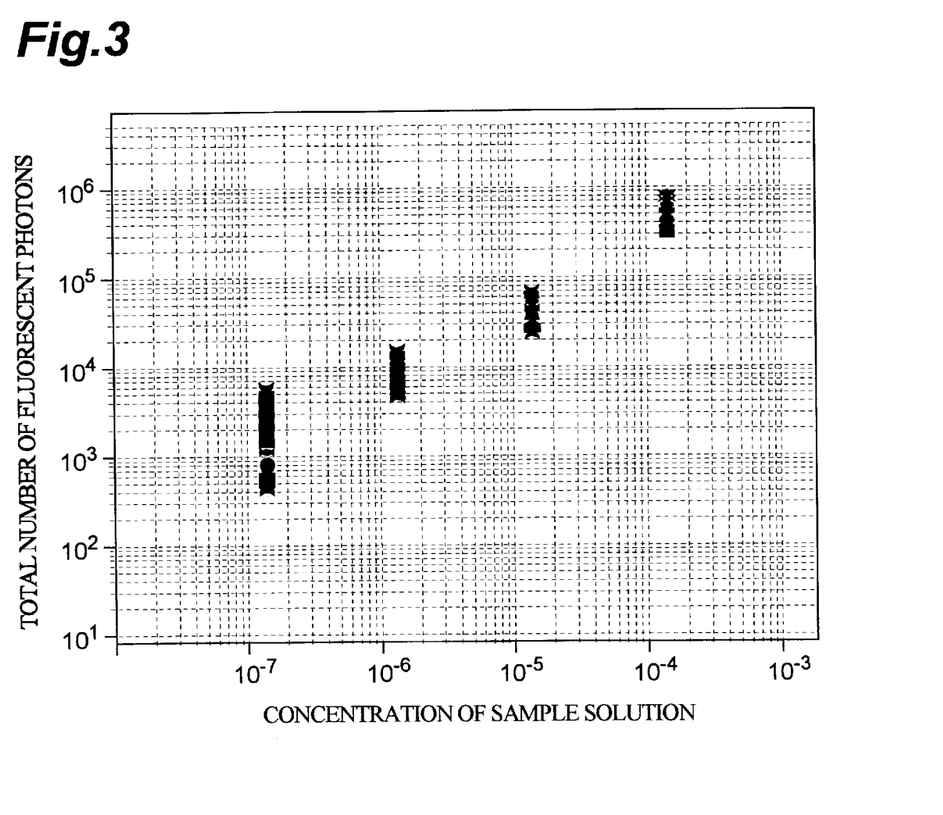
FIG. 3 is a diagram to show the relation between concentration of sample solution and number of total fluorescent photons.

Fluorescence intensity distributions in the surfaces in which the adsorptive pigment was present were not uniform as shown in FIGS. 4A–4D described hereinafter. However, the number of all photons summed up for the entire area of one image (512×483 pixels) were uniform within the range of factor 3 except for the case of $1.47 \times 10^{-7}$ M. Here, "factor 3" means that the degree of dispersion is three times. In the case of FIG. 3, the dispersion of total fluorescent photon number in the concentration of the sample solution being $1.47 \times 10^{-6}$ M is within the range of approximately 5000 counts to 15000 counts. This was described as being constant within the range of "factor 3."

The total photon number approximately showed the linear relation against the pigment concentration used in the preparation of sample solution 7, as shown in FIG. 3. FIG. 3 is a diagram to show the relationship between concentration of sample solution and total fluorescent photon number. The total fluorescent photon number is the sum of the number of fluorescent photons from the entire screen (512×483 pixels) and the number of photons from the background. The degree of uniformity of adsorption was evaluated from dispersion of total photon number in many images measured.

The number of images used for the evaluation was 10 in the case of $1.47 \times 10^{-4}$ M, 15 in the case of $1.47 \times 10^{-5}$ M, 64 in the case of $1.47 \times 10^{-6}$ M, and 50 in the case of $1.47 \times 10^{-7}$ M. The dispersion obtained was within factor 3 in the cases of $1.47 \times 10^{-4}$ M, $1.47 \times 10^{-5}$ M, and $1.47 \times 10^{-6}$ M. On the other hand, the dispersion was of the factor of approximately 15 in the case of $1.47 \times 10^{-7}$ M.

Figure 4A:
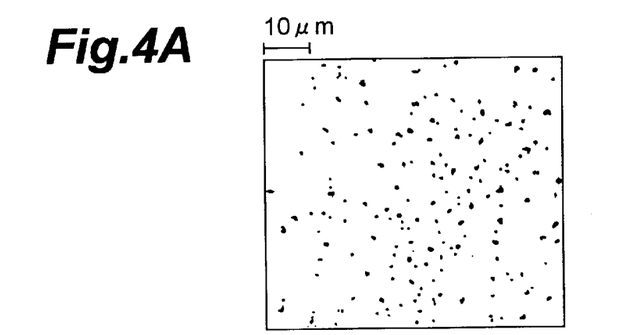
FIG. 4A shows a case of the sample solution of $1.47 \times 10^{-4}$ M, FIG. 4B a case of the sample solution of $1.47 \times 10^{-5}$ M, FIG. 4C a case of the sample solution of $1.47 \times 10^{-6}$ M and FIG. 4D a case of the sample solution of $1.47 \times 10^{-7}$ M.
Figure 4B:
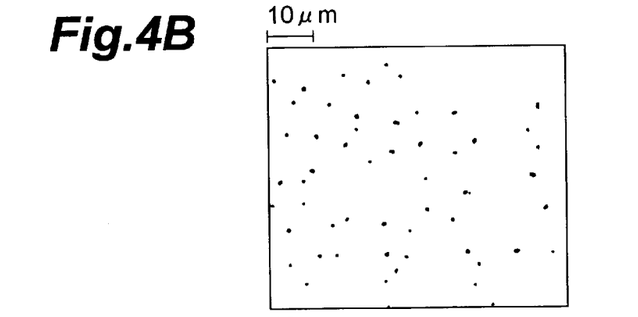
Figure 4C:
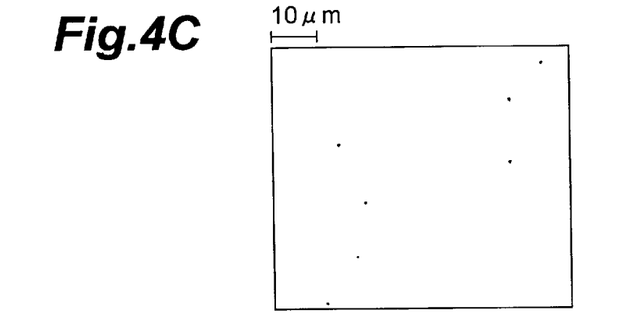
Figure 4D:
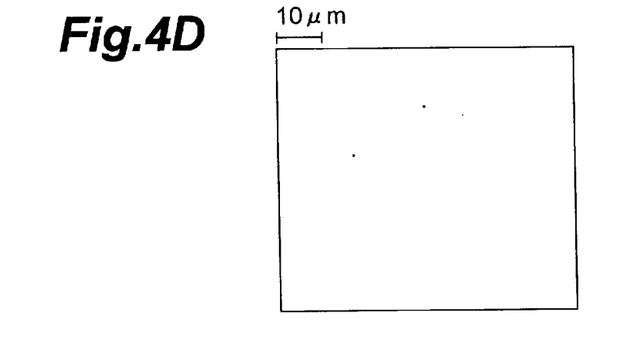

The reason of this large dispersion is that in the case of $1.47 \times 10^{-7}$ M luminous spots included per pixel are sporadic as shown in FIG. 4D described below. A dark count was measured while a window between the lens 16 and the lens 17 of the microscope shown in FIG. 2 was closed so as to prevent the fluorescence from entering a photoelectric surface of the camera head 12. The dark count was 50 counts/30 sec/all pixels. The sensitivity of camera was set to the maximum. Further, the total background including this dark count with the window open was approximately 330 counts/30 sec/all pixels. The sample solution 7 was not deposited on the substrate 5 upon the measurement of background.

FIGS. 4A–4D are drawings to show the traces of microphotographs of luminous spots of fluorescence obtained when the sample solution 7 of each concentration was prepared on the substrate 5. The concentration of each sample solution was $1.47 \times 10^{-4}$ M in FIG. 4A, $1.47 \times 10^{-5}$ M in FIG. 4B, $1.47 \times 10^{-6}$ M in FIG. 4C, or $1.47 \times^{-7}$ M in FIG. 4D. In these figures, the number of luminous spots increased with increase in the concentration of sample solution 7 and was 3, 14, 78, or 117 in FIGS. 4D to 4A, respectively. However, in FIG. 4A, identification of luminous spot was obscure, because the background fluorescence increased.

It is clear that the number of luminous spots saturates from FIG. 4A to FIG. 4B. This result suggests a possibility that luminous spots of fluorescence are formed on sites suitable for adsorption of pigment. From these images it is further seen that background-like fluorescent photons not contributing to the luminous spot appear in the concentrations of $1.47 \times 10^{-5}$ M and more. This excessive fluorescence is neither due to the solvent of the sample solution nor the contaminations in the air, but is due to the pigment itself.

The reason is that the concentration of sample solution is in the proportional relation with the total fluorescent photon number per pixel (fluorescence of luminous spots+excessive fluorescence) as shown in FIG. 3. If this excessive fluorescence were caused by any contamination, the excessive fluorescence would appear generally in the all images of FIGS. 4A–4D independent of the concentration of sample solution. It is, therefore, understood that in the present invention taking-in of contamination from the outside hardly occurs, because the volatile solvent is used.

Figure 5A:
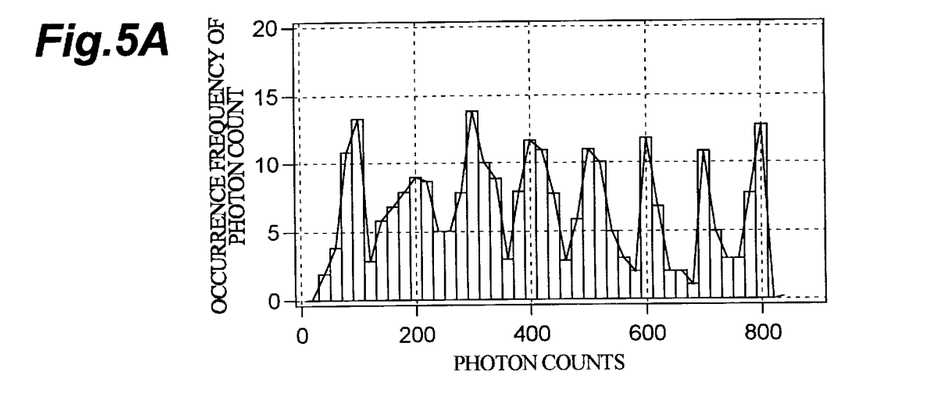
FIG. 5A shows a case of the sample solution of $1.47 \times 10^{-5}$ M, FIG. 5B a case of the sample solution of $1.47 \times 10^{-6}$ M, and FIG. 5C a case of the sample solution of $1.47 \times 10^{-7}$ M.
Figure 5B:
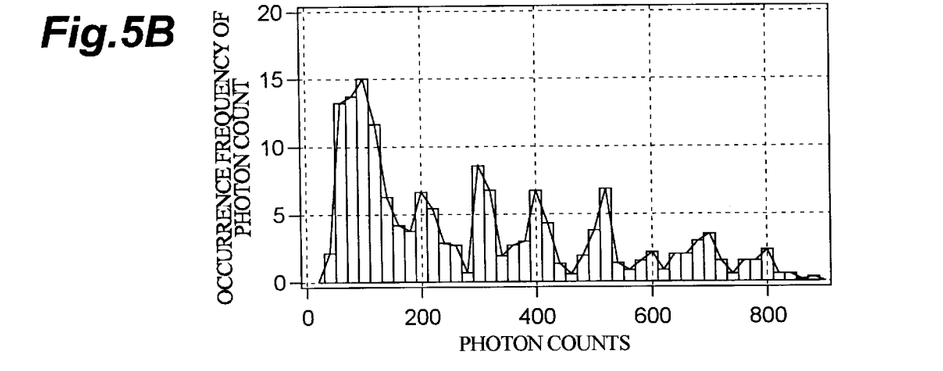
Figure 5C:
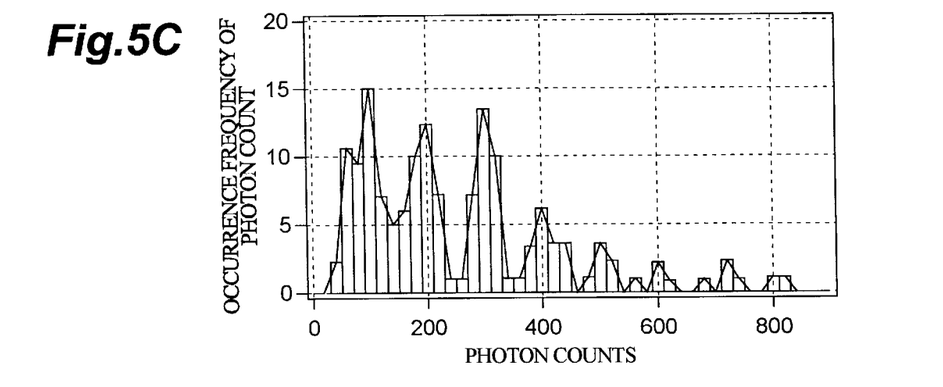

FIGS. 5A–5C are histograms to show statistical distributions of occurrence frequency of fluorescent photon number obtained when the numbers were counted for fluorescent photons contributing to individual luminous spots of fluorescence. FIGS. 5A to 5C correspond to the cases where the sample solutions of $1.47 \times 10^{-5}$ M, $1.47 \times 10^{-6}$ M, and $1.47 \times 10^{-7}$ M, respectively, were used. The histogram was not made for the sample solution of $1.47 \times 10^{-4}$ M, because identification of luminous spot became obscure because of the increase of the background fluorescence. The histograms were made by putting the obtained fluorescence count numbers on the scale of 20-count intervals. There were some cases of luminous spots of 1000 counts or more, but they were excluded from the histograms.

It is noted that the all three histograms illustrated in these figures show maxima at intervals of 100 counts. It is emphasized herein that the quantization at the intervals of 100 counts appeared independent of the concentrations of the sample solutions used in the preparation of adsorptive pigment. This result indicates that 100 counts result from one pigment molecule under the experiment conditions set in the embodiment of the present invention.

In addition to the above, there are two experimental facts to show that 100 counts result from one pigment molecule. The first fact is that optical fading of pigment advances stepwise and each step occurs at approximately 100 counts or at an integral multiple thereof (though the data is not presented herein). The second fact is that the number of fluorescent photons observable from one pigment molecule under predetermined experiment conditions is approximately 100 counts. Accordingly, the numbers of fluorescent photons quantized at the intervals of 100 counts as shown in FIGS. 5A–5C correspond to one to eight pigment molecules.

In the case of FIG. 4B, focusing attention on the luminous spots, the count numbers of 100 counts and integral multiples thereof are localized in circles of areas of 78 to 113 pixels. On the other hand, for obtaining 100 counts in the background part except for the luminous spots, it is necessary to set a circle of the area of about 1200 pixels. This result infers that the excessive background fluorescence except for the luminous spots as seen in FIG. 4A and FIG. 4B must originate in fluorescent molecules non-localized and, presumably, moving.

For verifying this inference, temperature dependence was checked of the form of fluorescence image. Specifically, it is expected that when the temperature is decreased, the thermal energy driving the molecules decreases to eliminate the non-localized background and to make localized luminous spots appear.

Figure 6A:
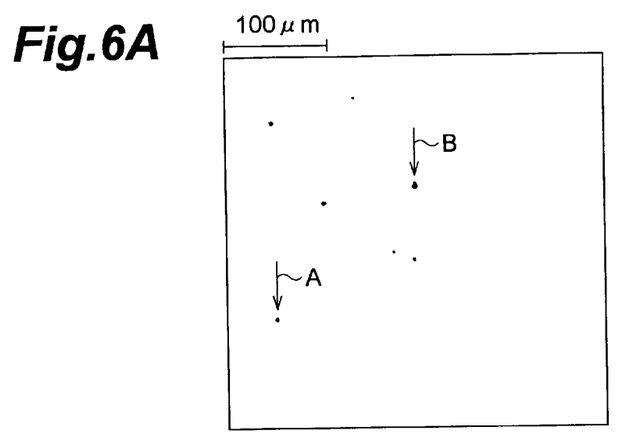
FIG. 6A shows luminous spots of fluorescence observed at 66 K, FIG. 6B luminous spots of fluorescence observed after the temperature is increased to 300 K, and FIG. 6 luminous spots of fluorescence observed after the temperature is again decreased to 66 K.
Figure 6B:
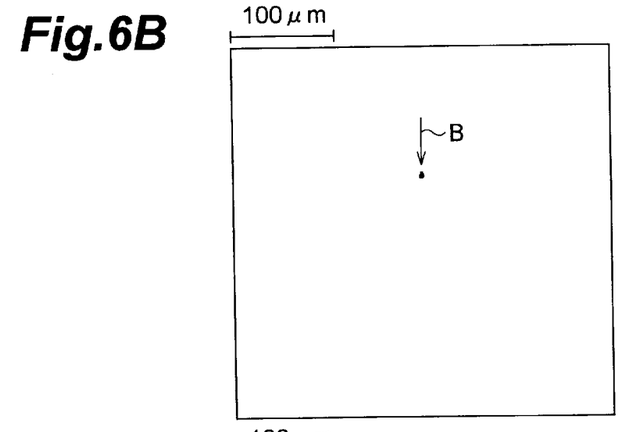
Figure 6C:
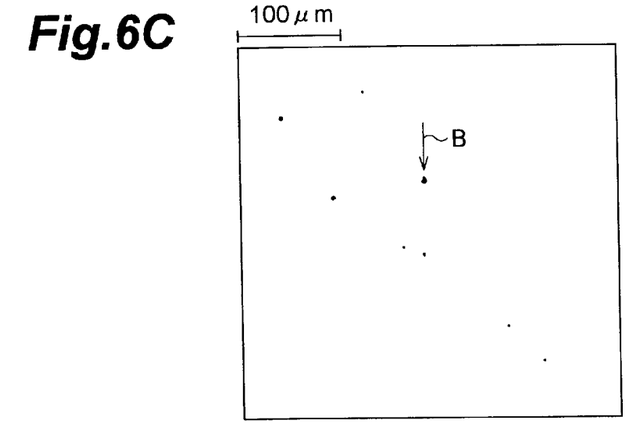

FIGS. 6A–6C are drawings to show the traces of microphotographs of luminous spots of fluorescence obtained when the temperature was changed in use of the sample solution of $1.47 \times 10^{-4}$ M. FIG. 6A shows luminous spots of fluorescence observed at 66 K, FIG. 6B luminous spots of fluorescence observed when t he temperature was raised to 300 K, and FIG. 6C luminous spots of fluorescence observed when the temperature was again decreased to 66 K.

The luminous spots of fluorescence observed in FIG. 6A disappeared in FIG. 6B and were again observed in FIG. 6C. This supports the view that the non-localized fluorescence as shown in FIGS. 4A and 4B described above is "due to the moving pigment molecules." It is thus clear that a single molecule layer of fluorescent molecules is formed on the surface of substrate 5.

The details of observation of luminous spot of fluorescence in FIGS. 6A–6C are as follows. In FIG. 6A, several luminous spots of fluorescence were seen inside fluorescence images of vague contour. In FIG. 6B almost all luminous spots of fluorescence observed at 66 K except for one disappeared. Further, several luminous spots of fluorescence again appeared in FIG. 6C. However, the number of luminous spot and the contrast of luminous spot could change from the case of FIG. 6A. Particularly, the luminous spot indicated by arrow A disappeared completely. The luminous spot indicated by arrow B was seen in common to the three images (wherein the luminous spot is not accompanied by the background of luminescence image of vague contour). The luminous spot, however, was observed in a somewhat vertically elongated shape in the case of 300 K (FIG. 6B). Therefore, this luminous spot is considered to be one from a site suitable for adsorption of pigment.

Some of the experiment conditions used herein were different from those in the cases of FIGS. 4A–4D. A cryostat for optical microscope was added onto the stage 11. The atmosphere of the substrate 5 on which the sample was placed was not the atmospheric pressure, but was $10^{-6}$ to $10^{-7}$ Torr. The objective lens 21 was an objective lens having the magnification 20, the numerical aperture 0.4, and the working distance 20 mm (trade name "NIKON CF M Plan SLWD" available from NIKON CORP.). The objective lens of low magnification was used for decreasing on an apparent basis influence of optical aberration caused by a quartz window 1.5 mm thick of the cryostat.

Since the experiment conditions were changed as described, quantitative comparison was not applicable between the photon numbers measured in FIGS. 6A–6C and the photon numbers measured in FIG. 3 to FIGS. 5A–5C. Therefore, let us focus attention only on the temperature dependence of fluorescent screen. The number of total photon counts from the entire image was 69618 in FIG. 6A, 29141 in FIG. 6B, and 49012 in FIG. 6C. No repeatability was thus seen between FIG. 6A and FIG. 6C.

On the other hand, when attention is focused on the luminous spot indicated by arrow B, the count number thereof is 797 in FIG. 6A, 478 in FIG. 6B, and 769 in FIG. 6C. Repeatability thus does exist between FIG. 6A and FIG. 6C. The count number decreased from FIG. 6A to FIG. 6C in the entire image, which is possibly because the pigment molecules desorbed from the substrate 5 under the reduced pressure of atmosphere.

This result supports the view that there exists some molecules of adsorptive pigment weakly adsorbing on the substrate 5. On the other hand, the repeatability of count number supports the view that the luminous spot indicated by arrow B is one from a site suitable for adsorption of pigment. A mechanism for decreasing the count number of this luminous spot at 300 K (FIG. 6B) from those at 66 K (FIGS. 6A and 6C) can be explained by the fact reported before (for example, Kemnitz, K., Tamai, N., Yamazaki, I., Nakashima, N., Yoshihara, K., J. Phys. Chem. 1986, 90, 5094–5101).

It is understood from the above that the pigment molecules made to adsorb without any fixing process on the surface of solid matter take two different states, localized and non-localized states. (1) The localized fluorescent photons form clusters and the clusters are composed of various numbers of (one to several) pigment molecules. This result is independent of the concentration of sample solution used in the preparation of adsorptive pigment. (2) on the other hand, the non-localized fluorescent photons were found in the case where the adsorptive pigment was prepared using the sample solution of higher concentration than $1.47 \times 10^{-5}$ M. This is caused by motion of pigment molecule. These newly found facts are expected to contribute to understanding the physical properties of pigment molecule in the adsorbed state in more detail than before.

In general, many chemical phenomena occurring on the surface of the substrate or the like are considered to be sensitive to two-dimensional arrangement or motion of adsorptive molecule. For example, reaction or catalysis on the surface of the substrate or the like occurs only when molecules encounter molecules or the surface of substrate so as to match a suitable reaction path. In the surface chemistry, clarification thereof is considered to depend essentially on understanding of motion of molecules of adsorptive system. In the past enormous studies in the adsorptive system, a descriptive image was assumed such that the molecules were uniformly distributed and fixed. To the contrary, the present invention verified that such an assumption was not always correct. The molecules to which the method for placing the fluorescent molecules on the surface of substrate according to the present invention, which may be so called as a fluorescent single molecule imaging method, can be applied are limited only to fluorescent ones, but important applications thereof can be contemplated.

Some applications of the method will be found in the analytical chemistry in the near future. In an application, a very small number of fluorescence-labeled or self-fluorescent target molecules, one target molecule in the extreme case, will be prepared on a surface of a substrate such as the silicon wafer. The method of the present invention needs to be further developed as the key technology to measurement of fluorescence in a miniaturized analytical chemistry system of a type utilizing the microscopic structure made on the surface of solid matter by the photolithography technology. Miniaturization of analytical chemistry system nowadays is the technology rapidly developing in the analytical chemistry. To understand the localization and motion properties of individual pigment molecules on the surface as clarified by the present invention would be a starting point for contemplating movement and fixation of molecule that must be required of future single molecule analyzing systems making use of the surface of solid matter.

Example 2

Next conducted was an experiment for clarifying a possibility that the luminous spots of fluorescence were coincident with positions of such holes as to selectively adsorb rhodamine B. The preparation of sample solution 7, the formation of single molecule layer on the substrate 5, etc. were carried out in the same manner as in Example 1.

Adopted in Example 2 was the light-scattering method for radiating laser light to the substrate 5, three-dimensionally capturing scattered light from the surface of substrate 5 under the experiment conditions described below, and recognizing actual states of defects and particles on the surface of substrate 5 from a scattering intensity distribution of the scattered light. In measurement of intensity of scattered light, intensities of scattered light can be measured in the range of 1 to $10^{-8}$ when an output obtained upon direct incidence of the laser light to a detector is defined as 1.

From the observation result as shown in FIG. 4D described above, it was presumed that originally existing holes on the substrate 5 covered by native oxide were mainly present at the positions where the luminous spots of fluorescence were observed. A possible interpretation behind this presumption is as follows.

The reason why the number of luminous spots of fluorescence increases as the concentration of rhodamine B solution, which is the adsorptive pigment used for preparing the sample solution 7, increases from $10^{-7}$ M via $10^{-6}$ M to $10^{-5}$ M is that rhodamine B gradually fills the holes on the substrate 5.

On the other hand, the number of luminous spots of fluorescence almost saturated in $10^{-5}$ M of the concentration of rhodamine B solution used for preparing the sample of adsorptive pigment and the fluorescence not forming any luminous spot increased in $10^{-4}$ M, which is because the holes were completely filled with rhodamine B and excessive rhodamine B overflowed. Thus, the adsorptive sample prepared with the rhodamine B solution of $10^{-5}$ M was used in the following experiment. The reason is that if the aforementioned presumption is correct a high correlation will be expectedly seen between the positions of luminous spots of fluorescence and the positions of holes in this sample.

Figure 7A:
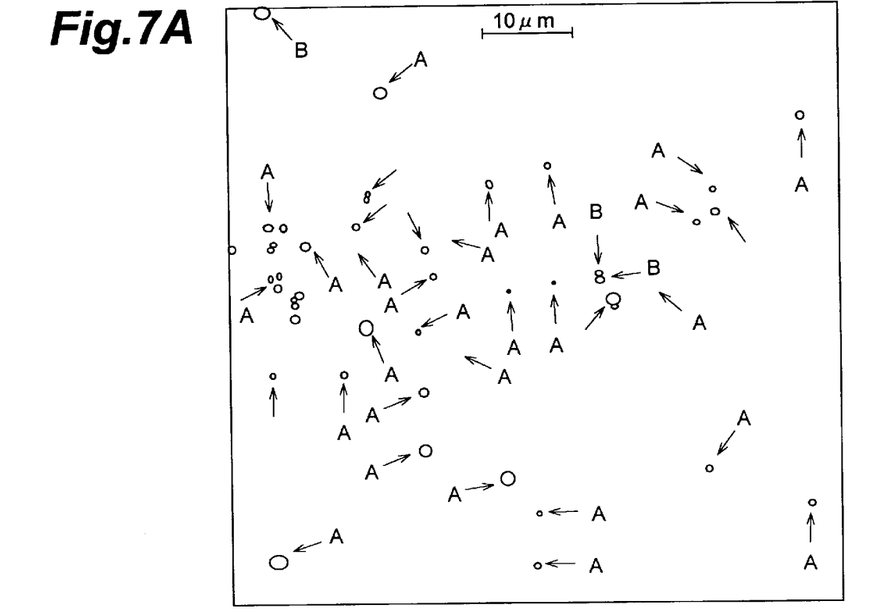
FIG. 7A shows luminous spots of scattered light observed with removing a long-path filter from the microscope and FIG. 7B luminous spots of fluorescence observed in the same field of view as in FIG. 7A with the long-path filter mounted on the microscope.

Using the fluorescent photon measuring apparatus shown in FIG. 2, observation was carried out on the sample prepared with the method described in FIGS. 1A and 1B with exciting the sample by laser and removing the long-pass filter (LP) 19 for cutting the excitation light but transmitting fluorescence, having been used upon the measurement of fluorescence, from the microscope. Observed were spots due to scattering of the green laser light. A trace of this microphotograph is shown in FIG. 7A. FIG. 7A shows a trace of the microphotograph obtained when scattered light was observed from the sample 7 prepared with the rhodamine B solution of $10^{-5}$ M without the long-pass filter 19, which was a filter for observing fluorescence.

As apparent from this figure, only luminous spots due to scattering of laser were observed. The laser used was an argon ion laser of continuous lasing (514.5 nm) and the power density thereof was approximately 0.05 W/cm². The sensitivity of the photon counting camera used for measurement of image was set to the minimum. In the figure, arrows A indicate luminous spots of scattered light of laser coincident with the positions of luminous spots of fluorescence. On the other hand, arrows B indicate luminous spots of scattered light of laser not coincident with the positions of luminous spots of fluorescence.

Then an image of fluorescence was observed in the same field as in the observation of the image of FIG. 7A, with the long-pass filter 19 being mounted. A trace of the microphotograph at this time is shown in FIG. 7B.

Figure 7B:
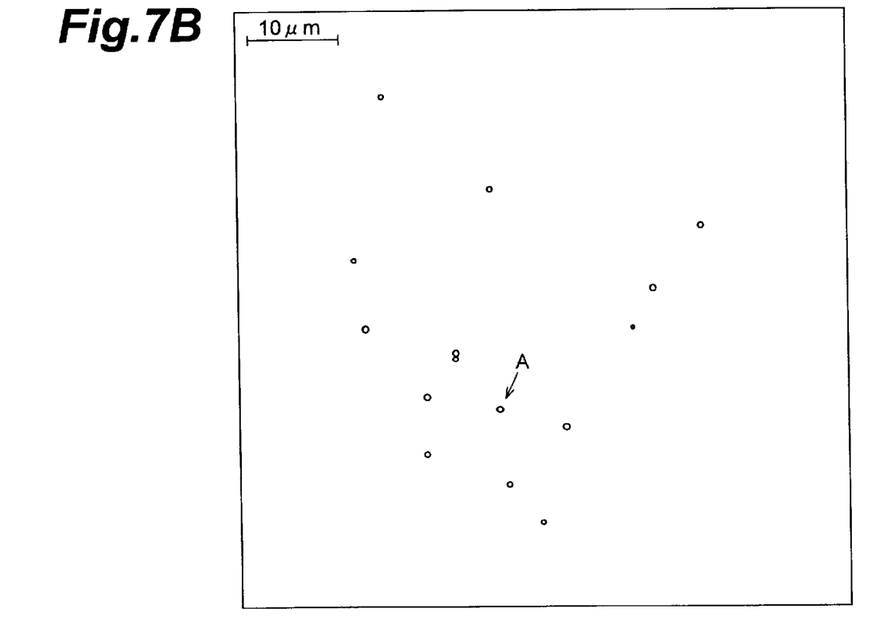

In FIG. 7B, the power density of the argon ion laser of continuous lasing (514.5 nm) was approximately 5 W/cm² and the sensitivity of the photon counting camera used for measurement of image was set to the maximum. An arrow A indicates a luminous spot of fluorescence not coincident with any position of luminous spot of scattered light of laser. This result shows that the rhodamine B itself is not a cause of the luminous spots of scattered light of laser. The sensitivity of the photon counting camera used herein is approximately $10^4$ greater than that in the case of the image of FIG. 7A. Since it was difficult to precisely compare the positions of luminous spots of scattered light of laser with the positions of luminous spots of fluorescence from the images shown herein, selection of luminous spots from FIGS. 7A and 7B was conducted using the original microphotographs.

From comparison of the images of FIGS. 7A and 7B, it is seen that there is a high correlation between the positions of luminous spots by the laser light and the positions of luminous spots of fluorescence. This experiment supports the presumption that the positions where the luminous spots of fluorescence were observed are mainly those of the originally existing holes on the substrate 5 covered by native oxide. of course, we cannot completely negate a possibility that particles adhering to the substrate 5 are a cause of the luminous spots of scattered light of the laser light.

Figure 8A:
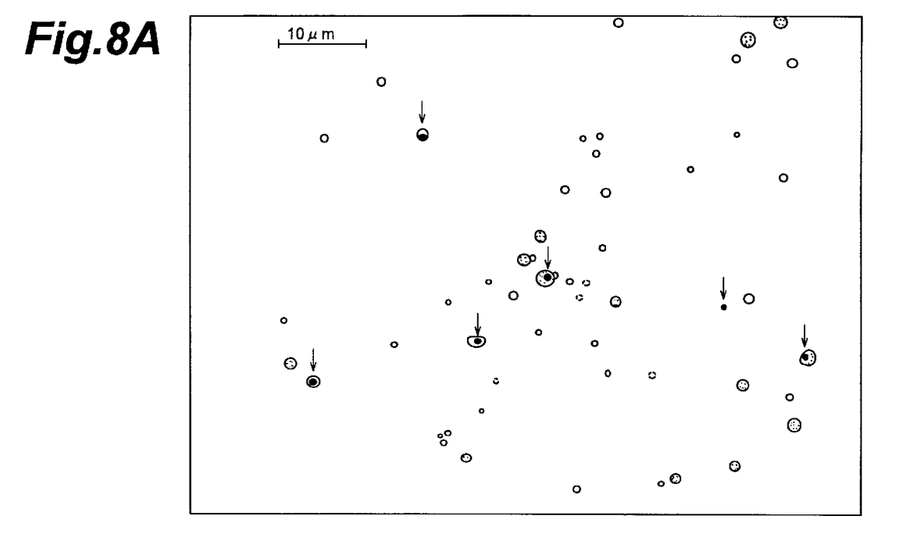
FIG. 8A shows luminous spots of scattered light observed with removing the long-path filter from the microscope and FIG. 8B luminous spots of fluorescence observed in the same field as in FIG. 8A with the long-path filter mounted on the microscope.
Figure 8B:
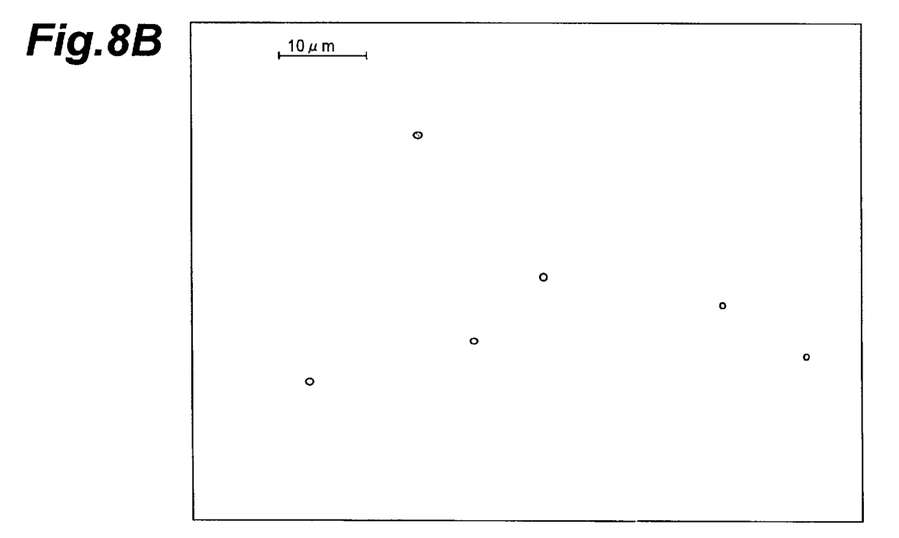

However, when observation was carried out using the substrate 5 polluted with particles that could be wiped off by cleaning paper, that is, when observation was carried out without wiping-off by the lens cleaning paper 6, the correlation between the positions of luminous spots of scattered light of laser and the positions of luminous spots of fluorescence was not so good, as shown in FIGS. 8A and 8B, when compared with FIGS. 7A and 7B. FIGS. 8A and 8B are drawings to show the traces of microphotographs taken under the same measurement conditions as in FIGS. 7A and 7B, respectively. In FIG. 8A the luminous spots of scattered light coincident with the positions of luminous spots of fluorescence are indicated by black dots indicated by arrows.

The holes and particles, i.e., concave portions and convex portions, both are observed in the observation of scattered light of laser; whereas the holes, i.e., the concave portions, are observed in the observation of fluorescence. Therefore, the correlation is not so good between FIGS. 8A and 8B. Accordingly, measurement of only concave portions becomes possible by taking the observation results of the scattered light of laser and the fluorescence into consideration. Namely, it becomes possible to determine whether a spot of scattered light of laser results from a particle or from a defect. Particularly, it becomes easier to detect a defect that is concave with respect to the surrounding surface.

As described above, structural defects of the surface of substrate can be visualized from the luminous spots of fluorescence and the luminous spots of scattered light.

As described above, according to the present invention, the fluorescent molecules are dissolved in the volatile, organic solvent, so that the measurement of fluorescence can be conducted without taking contaminations in from the outside and without being obstructed by the solvent and the contaminations. Since the lens cleaning paper is pulled so as to make the sample solution dropped onto the lens cleaning paper traverse the surface of substrate, the single molecule layer of fluorescent molecules with high uniformity can be readily placed on the surface of substrate.

Since measurement is done for the single molecule layer of fluorescent molecules with high uniformity placed on the surface of substrate, the measurement of fluorescence can be carried out accurately and the structural defects can be visualized on the surface of substrate from the luminous spots of fluorescence.

Further, since measurement is done for the single molecule layer of fluorescent molecules with high uniformity placed on the surface of substrate, the present invention presents such effects that the measurement of scattered light can be carried out accurately and that the structural defects can be visualized on the surface of substrate from the luminous spots of scattered light.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method for placing fluorescent single molecules on a surface of a substrate, on the occasion of carrying out measurement of fluorescence of fluorescent molecules, comprising the steps of:

dissolving said fluorescent molecules in a predetermined concentration in a volatile, organic solvent, thereby preparing a sample solution;

placing a slip of paper on a substrate where the measurement of fluorescence is carried out;

dropping said sample solution onto said slip of paper placed on said substrate; and then pulling said slip of paper so as to make the dropped sample solution traverse said surface of the substrate before said organic solvent evaporates thereby placing the fluorescent single molecules on the surface of the substrate, wherein the fluorescent single molecules are distinguishable on the surface of the substrate.

2. A method for placing fluorescent single molecules on a surface of a substrate, according to claim 1, wherein said organic solvent is one selected from the group consisting of alcohols, ethers, and acetone.

3. A method for placing fluorescent single molecules on a surface of a substrate, according to claim 1, wherein said slip of paper is a slip of paper selected from the group consisting of lens cleaning paper, carbon base paper, and thin paper.

4. A method for placing fluorescent single molecules on a surface of a substrate, according to claim 1, wherein the concentration of said fluorescent molecules is $10^{-4}$ M or less.

5. A method for visualizing a structural defect of a surface of a substrate, on the occasion of carrying out measurement of fluorescence of fluorescent molecules, comprising the steps of:

dissolving said fluorescent molecules in a predetermined concentration in a volatile, organic solvent, thereby preparing a sample solution;

placing a slip of paper on a substrate where the measurement of fluorescence is carried out;

dropping said sample solution onto said slip of paper placed on said substrate;

pulling said slip of paper so as to make the dropped sample solution traverse said surface of the substrate before said organic solvent evaporates, thereby placing the fluorescent single molecules on the surface of the substrate wherein the fluorescent single molecules are distinguishable on the surface of the substrate;

radiating laser light to the surface of said substrate on which said fluorescent single molecules are placed;

then measuring fluorescence generated in said surface of the substrate; and obtaining a luminous spot of fluorescence from the fluorescence measured.

6. A method for visualizing a structural defect of a surface of a substrate, according to claim 5, wherein said organic solvent is one selected from the group consisting of alcohols, ethers, and acetone.

7. A method for visualizing a structural defect of a surface of a substrate, according to claim 5, wherein said slip of paper is a slip of paper selected from the group consisting of lens cleaning paper, carbon base paper, and thin paper.

8. A method for visualizing a structural defect of a surface of a substrate, according to claim 5, wherein the concentration of said fluorescent molecules is $10^{-4}$ M or less.

9. A method for visualizing a structural defect of a surface of a substrate, on the occasion of carrying out measurement of scattered light of the surface of the substrate wherein the fluorescent single molecules are distinguishable on the surface of the substrate; on which fluorescent molecules are deposited, comprising the steps of:

dissolving said fluorescent molecules in a predetermined concentration in a volatile, organic solvent, thereby preparing a sample solution;

placing a slip of paper on a substrate where the measurement of scattered light is carried out;

dropping said sample solution onto said slip of paper placed on said substrate;

pulling said slip of paper so as to make the dropped sample solution traverse said surface of the substrate before said organic solvent evaporates, thereby placing the fluorescent single molecules on the surface of the substrate;

radiating laser light to the surface of said substrate on which said fluorescent single molecules are placed;

then measuring scattered light generated in said surface of the substrate; and obtaining as luminous spot of scattered light from the scattered light measured.

10. A method for visualizing a structural defect of a surface of a substrate, according to claim 9, wherein said organic solvent is one selected from the group consisting of alcohols, ethers, and acetone.

11. A method for visualizing a structural defect of a surface of a substrate, according to claim 9, wherein said slip of paper is a slip of paper selected from the group consisting of lens cleaning paper, carbon base paper, and thin paper.

12. A method for visualizing a structural defect of a surface of a substrate, according to claim 9, wherein the concentration of said fluorescent molecules is $10^{-4}$ M or less.

* * * * *